United States Patent
Teng et al.

(10) Patent No.: US 8,113,697 B2
(45) Date of Patent: Feb. 14, 2012

(54) PASSIVE HEAT SINK AND LIGHT EMITTING DIODE LIGHTING DEVICE USING THE SAME

(75) Inventors: Yen Chu Teng, Hsinchu County (TW); Chia Chen Chang, Yilan County (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 384 days.

(21) Appl. No.: 12/498,565

(22) Filed: Jul. 7, 2009

(65) Prior Publication Data

US 2010/0020553 A1   Jan. 28, 2010

(30) Foreign Application Priority Data

Jul. 24, 2008   (TW) ................................. 97128062 A

(51) Int. Cl.
*F21V 29/00* (2006.01)
(52) U.S. Cl. ........................................................ 362/373
(58) Field of Classification Search .................. 362/294, 362/373, 345
See application file for complete search history.

(56) References Cited

U.S. PATENT DOCUMENTS

| | | | | |
|---|---|---|---|---|
| 5,172,975 | A * | 12/1992 | Parker | 362/373 |
| 6,748,656 | B2 * | 6/2004 | Woerner et al. | 29/890.03 |
| 7,284,882 | B2 * | 10/2007 | Burkholder | 362/294 |
| 7,492,599 | B1 * | 2/2009 | Yu et al. | 361/719 |
| 7,674,011 | B2 * | 3/2010 | Zhou et al. | 362/249.02 |
| 7,878,686 | B2 * | 2/2011 | Suehiro et al. | 362/294 |
| 7,992,624 | B2 * | 8/2011 | Huang | 165/80.3 |
| 2004/0222516 | A1 | 11/2004 | Lin et al. | |
| 2004/0244959 | A1 | 12/2004 | Chien et al. | |
| 2009/0244900 | A1 * | 10/2009 | Chang et al. | 362/294 |

FOREIGN PATENT DOCUMENTS

| | | |
|---|---|---|
| CN | 2831424 Y | 10/2006 |
| JP | 2000-049264 A | 2/2000 |
| JP | 2002-064167 A | 2/2002 |
| JP | 2006-245084 A | 9/2006 |

\* cited by examiner

*Primary Examiner* — Alan Cariaso
(74) *Attorney, Agent, or Firm* — Altis Law Group, Inc.

(57) ABSTRACT

A light emitting diode (LED) lighting device is provided. The LED lighting device includes an LED light bar and a passive heat sink. The passive heat sink includes a base and a plurality of heat sink fins. The LED light bar is placed on one side of the base, and the heat sink fins are placed on the other side of the base. The fins are fixed on the base by soldering.

15 Claims, 8 Drawing Sheets

PASSIVE HEAT SINK AND LIGHT EMITTING DIODE LIGHTING DEVICE USING THE SAME

BACKGROUND OF THE INVENTION

1. Field of the Invention

The present invention relates to a heat sink module and a lighting device, and relates more particularly to a type of heat sink fin and a light emitting diode lighting device using the same.

2. Description of the Related Art

Light emitting diodes (hereinafter "LED") were initially used only in indicator lights of electronic devices, and now are increasingly applied to the backlights of liquid crystal display devices, and even further to electrical illumination devices or public displays such as vehicle lighting apparatuses, traffic lights, electronic sign boards, large video walls or the illumination devices in projectors. Their range of applications continues to expand.

While light emitting diodes are emitting light, heat is generated, and LEDs producing higher luminous intensities generate greater levels of heat. If generated heat is not efficiently dissipated, the accumulated heat may quickly increase the temperature of the light emitting diodes and its surrounding environment. High temperature may have detrimental effects on the light emitting diodes. Therefore, in an LED light device, a heat sink is normally required to effectively dissipate the heat generated by light emitting diodes.

To date, the heat sink fins of many heat sink modules are produced using an aluminum extrusion process. FIG. 1 shows a traditional aluminum extrusion-processed heat sink module that is popular in the market. The heat sink module 1 includes a base 11 and a plurality of heat sink fins 12, which is directly formed on the base 11. The heat sink module 1 is fabricated by extruding aluminum or aluminum alloy through a die in an extrusion machine after the aluminum or the aluminum alloy is heated to a molding temperature (400° C.-500° C.).

Because aluminum or aluminum alloy is extruded through a die to form heat sink fins 12, the heat sink fins 12 of the heat sink module 1 have to be of at least a minimum thickness to avoid breakage during the extrusion process. If larger heat sink fins are desired, a new extrusion die must be prepared, and the manufacturing cost is increased. In addition, the required thickness of the heat sink fins limits the heat dissipation area of the heat sink module.

Consequently, if the heat sink fins 12 must be of at least a minimum thickness, the material cost is increased and the heat dissipation area of the heat sink module is limited.

As an alternative to the aluminum extrusion process, many heat sink modules are manufactured using die-casting method. The die-casting method is used to form a metal object by injecting molten metal into a mold cavity under a predetermined pressure. Compared to the aluminum extrusion process, the die-casting method can manufacture heat sink fins of more shapes and configurations. FIG. 2 shows another traditional heat sink module 1', which includes a base 11' and a plurality of heat sink fins 12'. The heat sink fins 12' disposed in a radial manner on the base 11' are produced using die-casting method.

Because the heat sink fins 12' of the heat sink module 1' are die cast, the heat sink fins 12' have to be of at least a minimum thickness to avoid breakage when the heat sink fins 12' are demolded. In addition, if heat sink modules 1' with more or fewer heat sink fins 12' is to be produced, a new molding die must be prepared, and the manufacturing cost is increased.

Thus, a method to make the heat sink fins of a heat sink module as thin as possible to lower their manufacturing cost is worth consideration by persons skilled in the art.

SUMMARY OF THE INVENTION

The objective of the present invention is to provide a passive heat sink module and a light emitting diode lighting device using the same. The heat sink fin of the heat sink module is thinner so that the manufacturing cost of the heat sink module is low.

In accordance with the above and other objectives, the present invention proposes a light emitting diode lighting device. The light emitting diode lighting device comprises an LED light bar and a passive heat sink module. The passive heat sink module comprises a base and a plurality of heat sink fins. The LED light bar is disposed on one side of the base, and the plurality of heat sink fins is disposed on the other side of the base. The plurality of heat sink fins can be soldered on the base.

In the light emitting diode lighting device, the plurality of heat sink fins is disposed on the base at a uniform interval.

In the light emitting diode lighting device, the plurality of heat sink fins is disposed on the base in a radial arrangement.

In the light emitting diode lighting device, each of the plurality of heat sink fins comprises a main slice, at least one connecting slice, and at least one connecting concave notch. The connecting slice is disposed on and protrudes from the lateral side of the main slice, and the connecting slice includes at least one connecting convex strip. In addition, at least one connecting concave notch is disposed on the main slice, and the connecting convex strip of each of the plurality of heat sink fins can engage into the connecting concave notch of an adjacent heat sink fin.

In the light emitting diode lighting device, the LED light bar is disposed on one side of the base in a locking manner, and a heat sink paste is applied between the LED light bar and the base.

In the light emitting diode lighting device, the plurality of heat sink fins is made by a press forming process.

In accordance with the above and other objectives, the present invention proposes a passive heat sink module comprising a base and a plurality of heat sink fins. The heat sink fins are disposed to one side of the base. The heat sink fins are fixed to the base by soldering.

Because the heat sink fins of the heat sink module of the present invention are manufactured first, and subsequently soldered to the base of the heat sink module, each heat sink fin can be made as thin as possible. Moreover, when a manufacturer produces heat sink fins of different sizes or shapes, the manufacturer can use the original manufacturing tools to produce another set of heat sink fins and then solder them to the base. No new die or mold is required so that manufacturing cost can be effectively reduced.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF THE INVENTION

Figure 3:
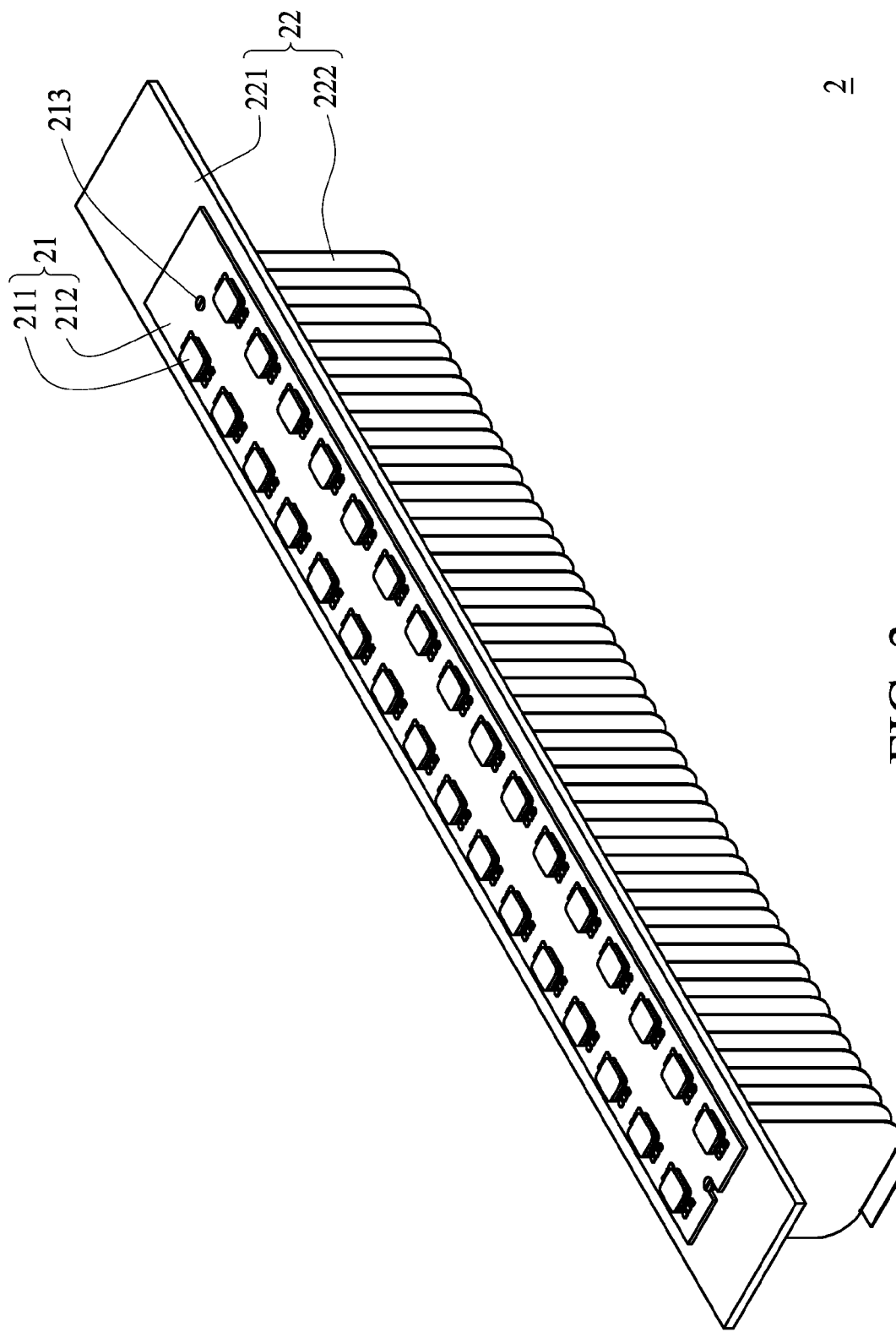
FIG. 3 shows a light emitting diode (LED) lighting device according to one embodiment of the present invention.

FIG. 3 shows a light emitting diode (LED) lighting device according to one embodiment of the present invention. The light emitting diode lighting device 2 comprises an LED light bar 21 and a passive heat sink module 22. The LED light bar 21 includes a plurality of light emitting diodes 211 and an aluminum base plate 212, on which the plurality of the light emitting diodes 211 is disposed. The aluminum base plate 212 can be one type of metal core printed circuit board with an aluminum sheet having better heat transfer capability for increasing heat dissipation.

Compared to an active heat sink module requiring electrical power to drive a fan for dissipating heat, the passive heat sink module 22 is a heat sink module that needs no electrical power and does not include a fan. In the present embodiment, the passive heat sink module 22 includes a base 221 and a plurality of heat sink fins 222, which is disposed on the base 221 at a uniform interval. The base 221 and the heat sink fins 222 are made of materials of high conductivity such as aluminum or copper. The plurality of heat sinks 222 is bonded to the based 221 by soldering. The soldering can be, for example, carried out using surface mounted technology (SMT).

The LED light bar 21 can be fastened to one side of the base 221 using screws 213, and a heat sink paste (not shown) can be applied between the LED light bar 21 and the base 221 for reducing thermal resistance between the LED light bar 21 and the base 221.

Figure 4A:
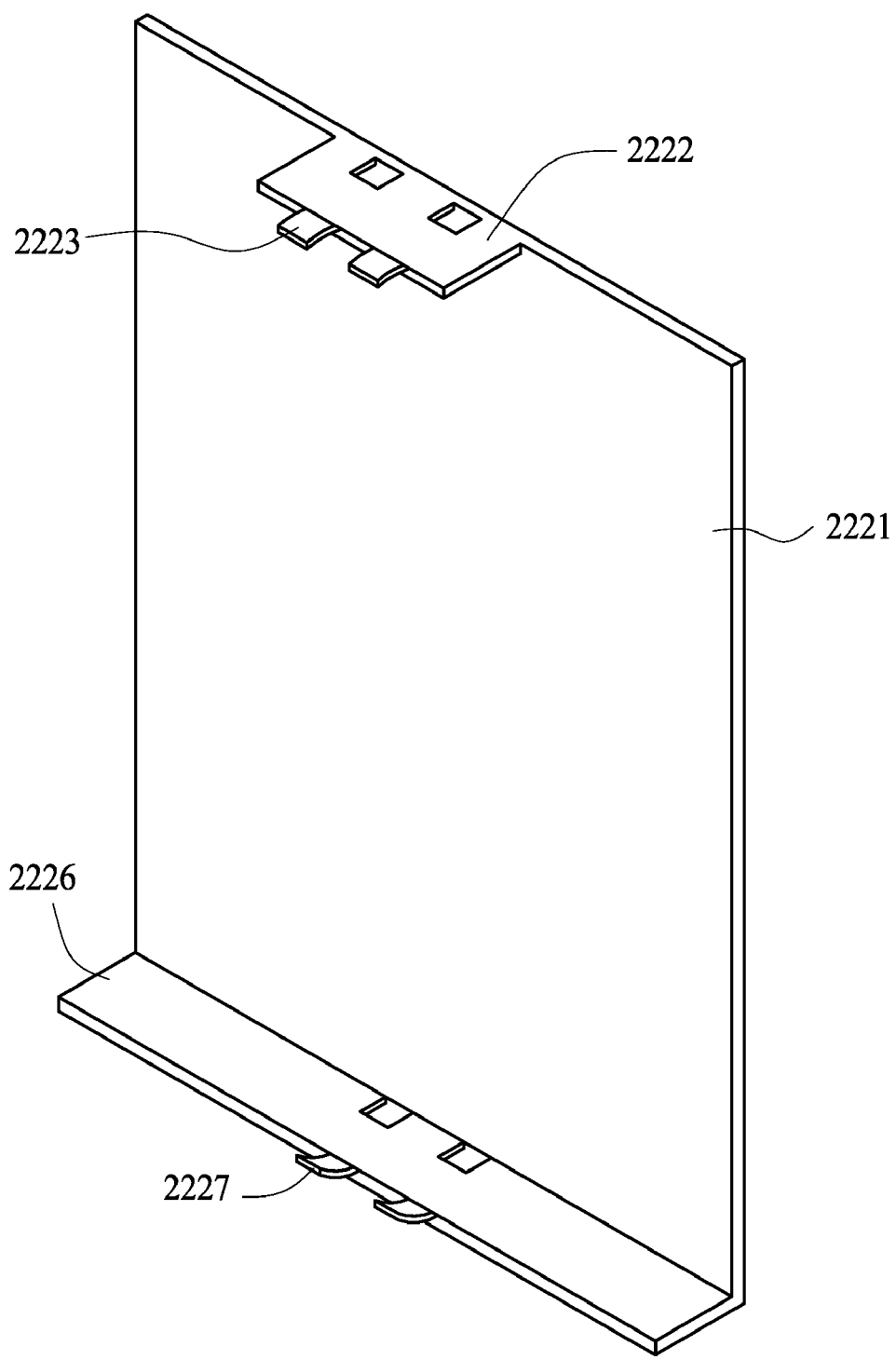
FIG. 4A is a perspective view of a heat sink fin according to one embodiment of the present invention.

FIG. 4A is a perspective view of a heat sink fin 222 according to one embodiment of the present invention. The heat sink fin 222 comprises a main slice 2221, and connecting slices 2222 and 2226. The connecting slice 2222 is disposed at the upper lateral side edge of the main slice 2221; and the connecting slice 2226 is disposed at the lower lateral side edge of the main slice 2221. Both connecting slices 2222 and 2226 protrude forward. Further, the connecting slice 2222 is connected with two connecting convex strips 2223 that protrude forward with slight downward bends, and the connecting convex strips 2227 that are connected to the connecting slice 2226 protrude forward with slight upward bends.

Figure 4B:
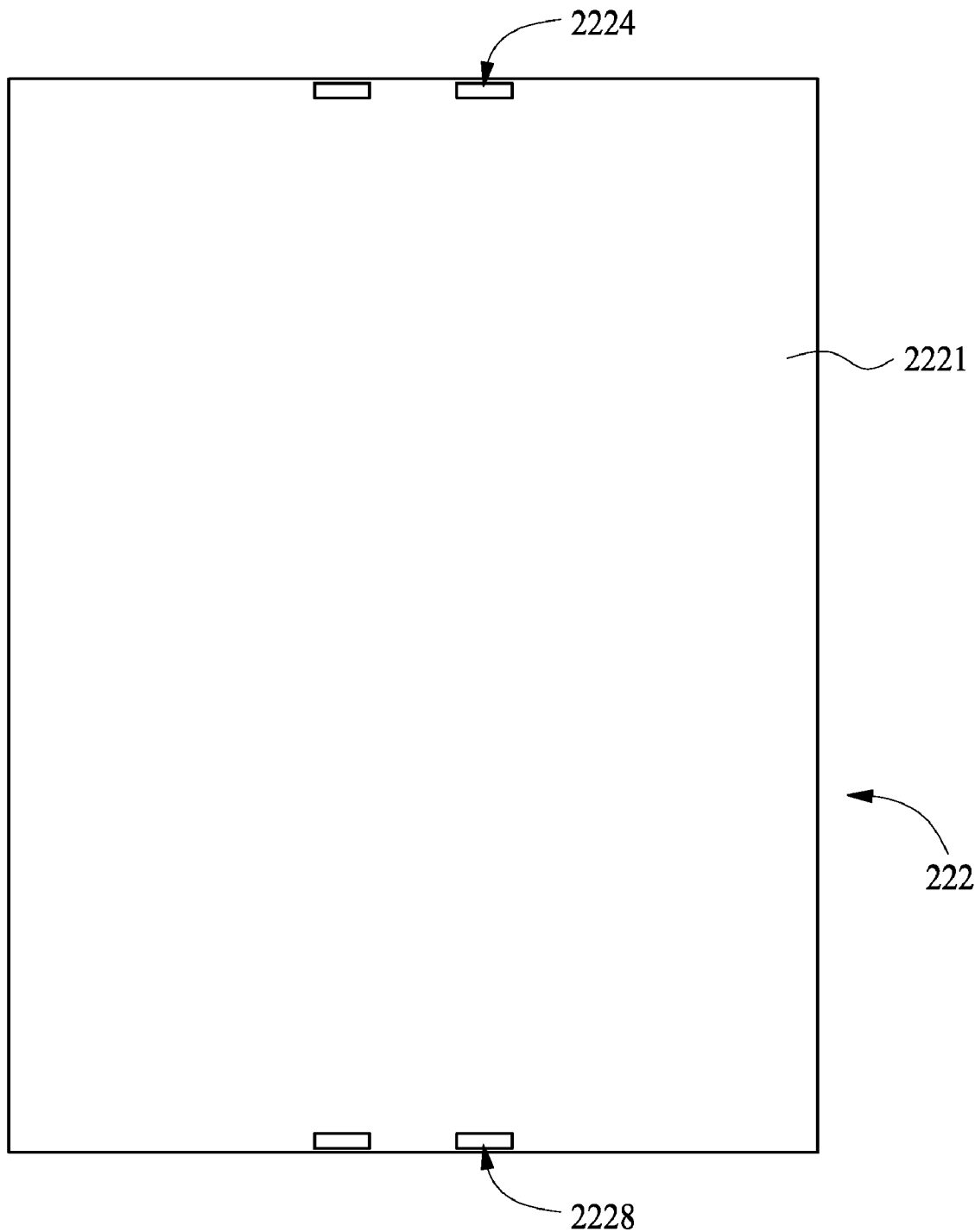
FIG. 4B is a rear view of a heat sink fin according to one embodiment of the present invention.
Figure 4C:
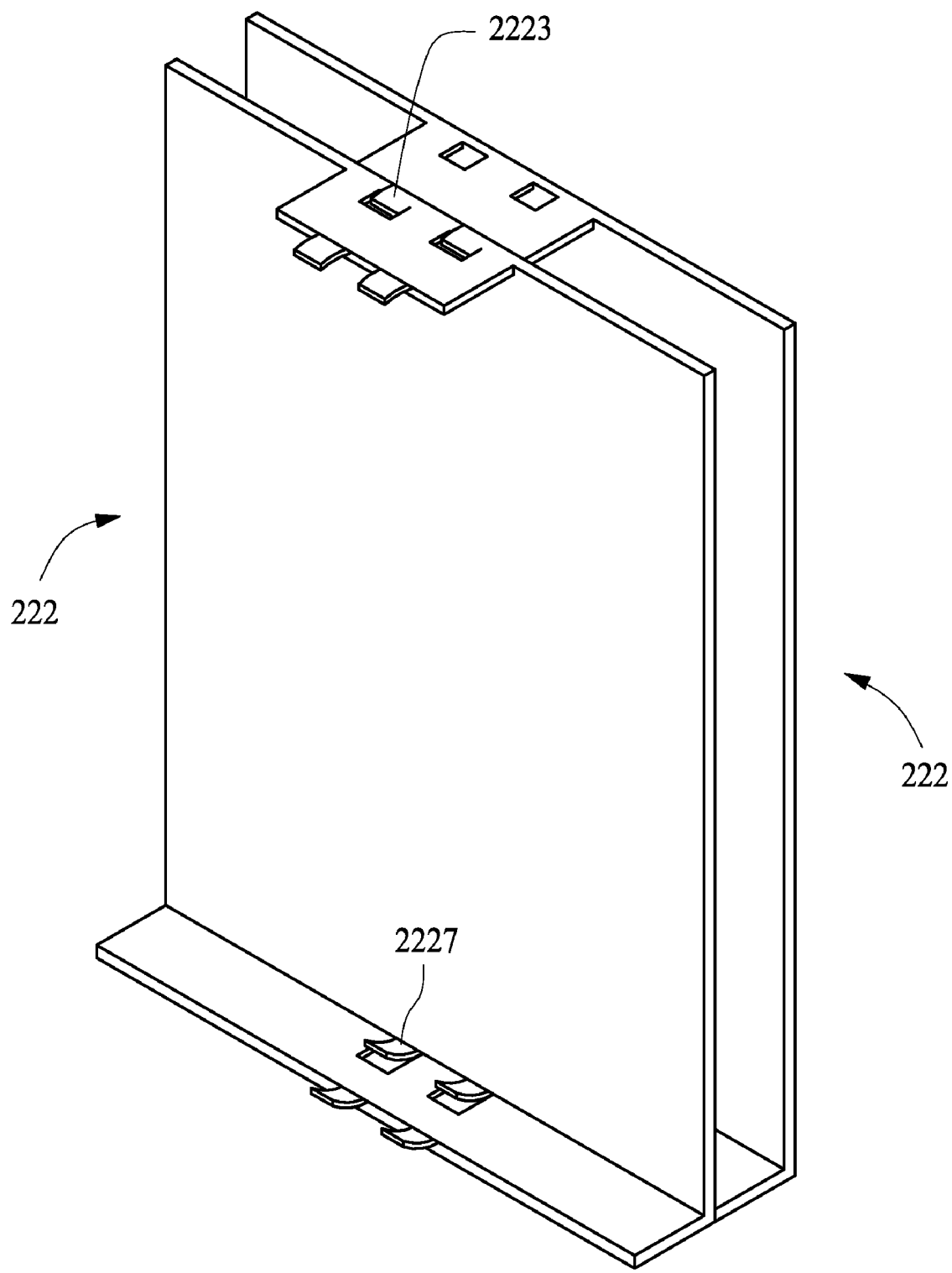
FIG. 4C is a perspective view of the assembly of two adjacent heat sink fins according to one embodiment of the present invention.

FIG. 4B is a rear view of a heat sink fin according to one embodiment of the present invention. As can be seen in FIG. 4B, the heat sink fin 222 further comprises two connecting concave notches 2224 and two connecting concave notches 2228 that are disposed, separately close to the upper edge and the lower edge, on the back side of the main slice 2221. Specifically, the connecting concave notch 2224 is disposed to correspond with the connecting convex strip 2223; and the connecting concave notch 2228 is disposed to correspond with the connecting convex strip 2227. The connecting concave notches 2224 and 2228 are adapted to insert into the connecting convex strips 2223 and 2227 of the next heat sink fin 222. Consequently, the engagement of the connecting convex strips 2223 and 2227 and the connecting concave notches 2224 and 2228 can connect two adjacent heat sink fins 222. Therefore, after the heat sink module 22 of the present embodiment is manufactured, a producer can pre-assemble several heat sink fins 222 together, and then solder the heat sink fins 222 onto the base 221. Furthermore, the disposition of the connecting slice 2222 can also increase the heat dissipation area.

Figure 5:
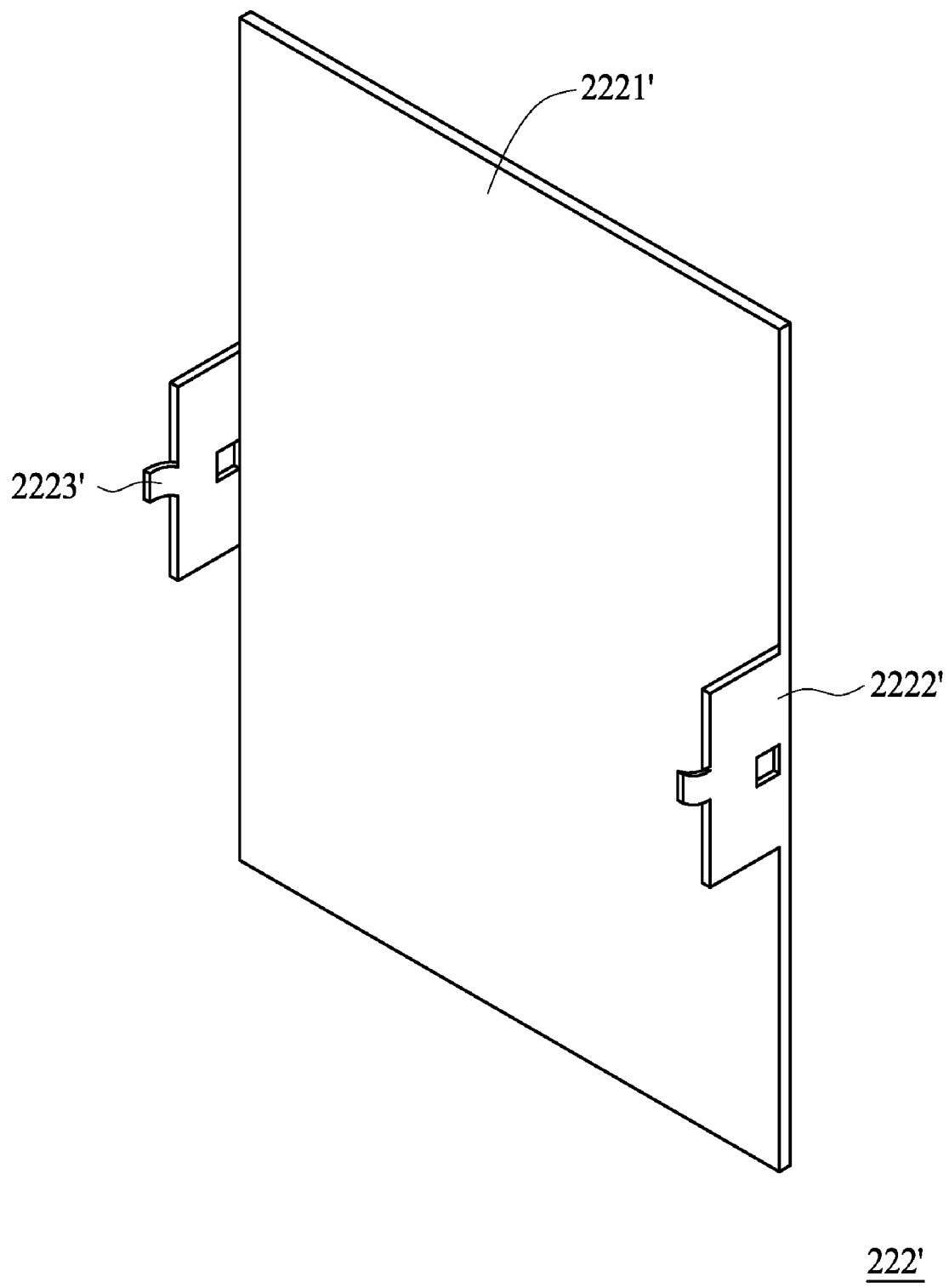
FIG. 5 is a perspective view of a heat sink fin according to another embodiment of the present invention.

The connection between the heat sink fins 222 is not limited to the connecting manner as shown above. For example, the main slice 2221 can alternatively have only the connecting slice 2222 disposed close to the upper edge thereof, without the connecting slice 2226; or each connecting slice 2222 can alternatively have only one connecting convex strip 2223 disposed thereto. Referring to FIG. 5, persons skilled in the art can understand that the connecting slices 2222' can be disposed close to both sides of the main slice 2221', and each connecting slice 2222' can have one connecting convex strip 2223' disposed thereto.

Figure 1:
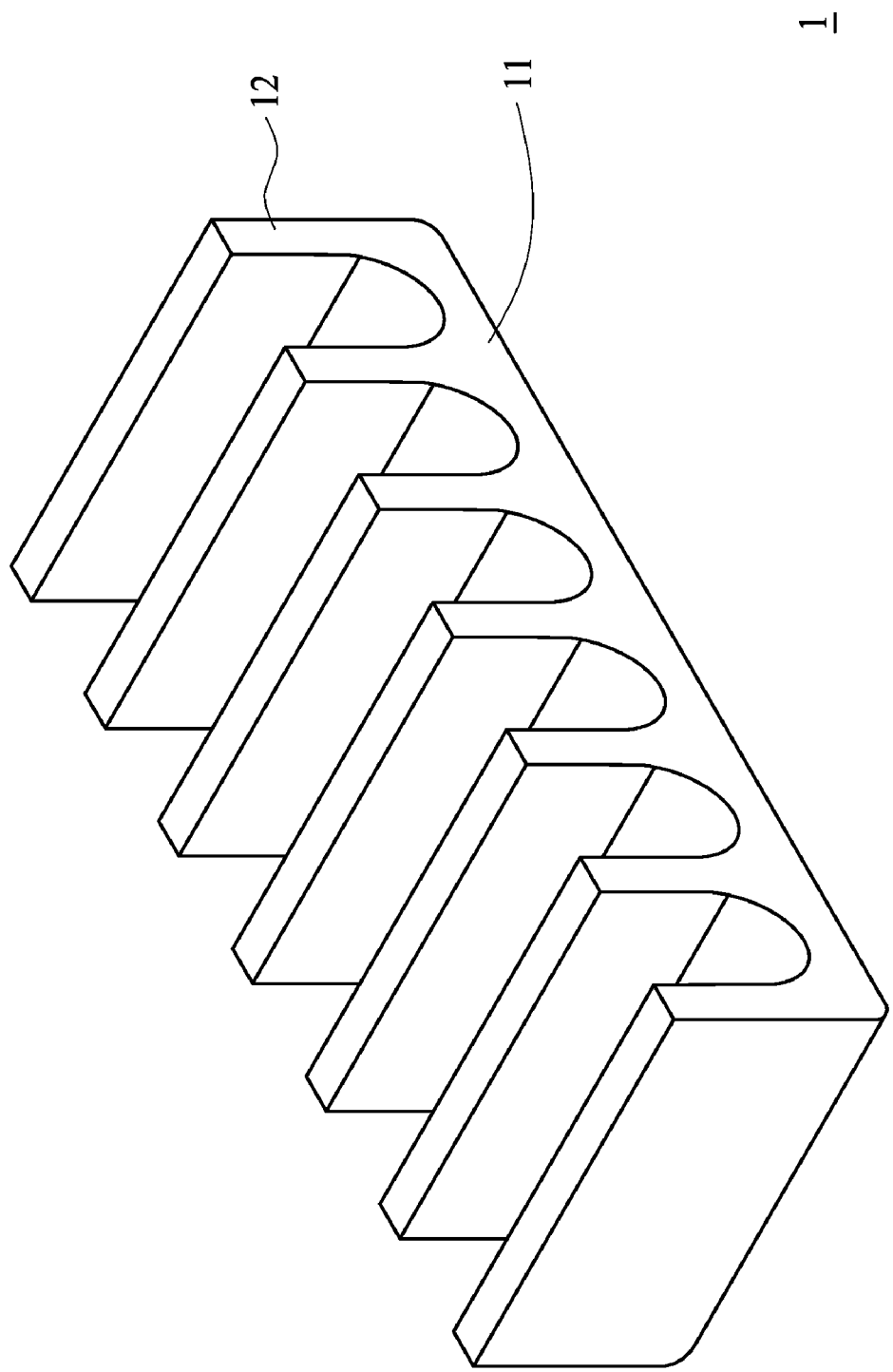
FIG. 1 shows a traditional extrusion-processed heat sink module that is popular in the market.

Referring to FIG. 3 again, the heat sink fins 222 can initially be fabricated by a press forming process, and the base 221 can be fabricated using an aluminum extrusion process. Next, the heat sink fins 222 are fixed to the base 221 by soldering. Compared to the heat sink fins 12 of a passive heat sink module 1 shown in FIG. 1, the heat sink fins 222 of the present embodiment need not be manufactured by die extrusion and so can be of reduced thickness. For example, the thickness of an extrusion-processed heat sink fin 12 generally is greater than 1 millimeter, and the thickness of the heat sink fins 222 of the present embodiment can be less than 1 millimeter. Furthermore, to produce heat sink fins of different shapes, for example taller heat sink fins, producers need not prepare another die. The taller heat sink fins can be made using the same die and then soldered to the base 221. Moreover, according to experiment results, compared to the extrusion-processed passive heat sink module, the passive heat sink module 22 of the present embodiment with equivalent heat dissipation area can reduce material needs by approximately 30%. Therefore, the manufacturing cost of the passive heat sink module 22 of the present embodiment can be effectively reduced.

Figure 6:
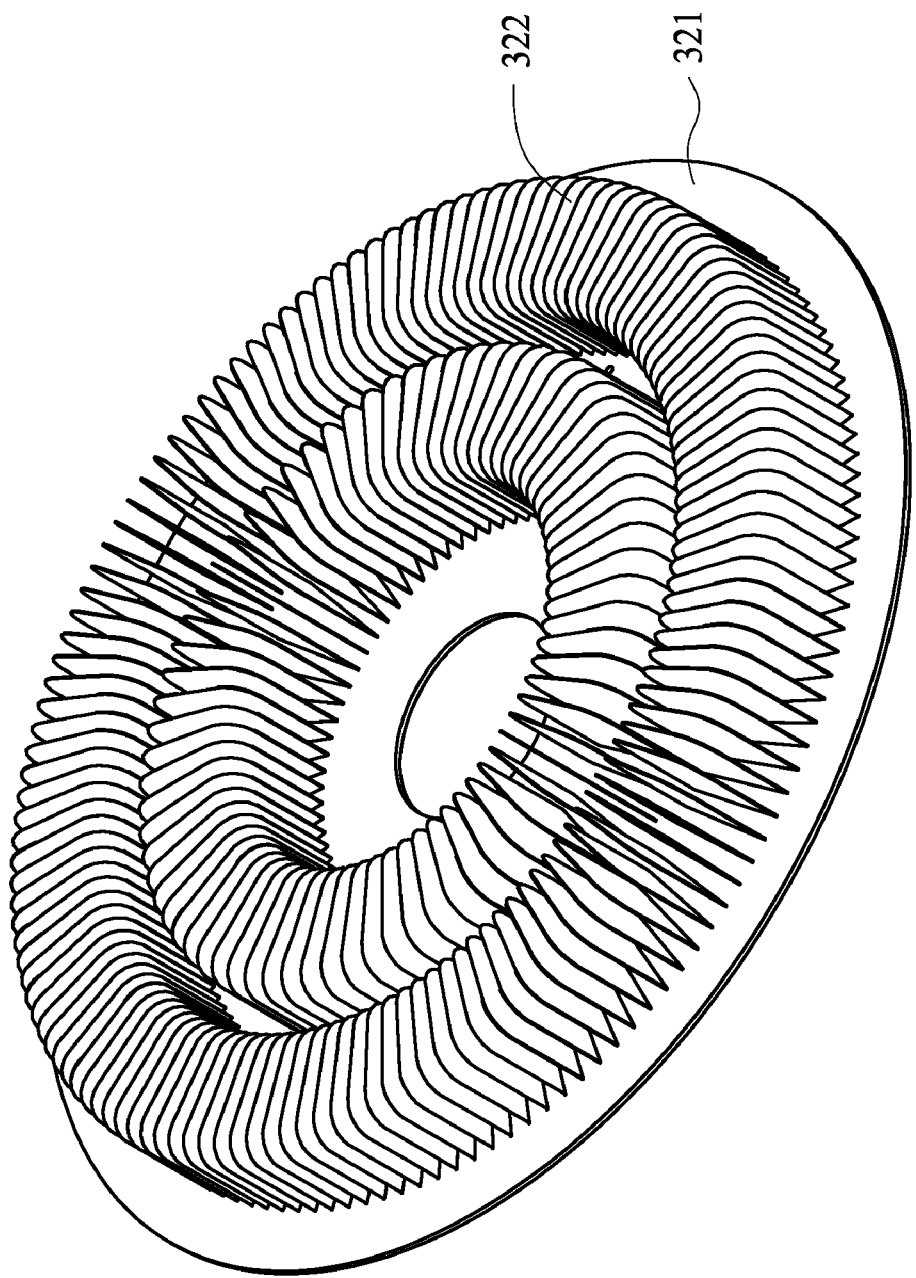
FIG. 6 shows a passive heat sink module according to the second embodiment of the present invention.

FIG. 6 shows a passive heat sink module according to the second embodiment of the present invention. The passive heat sink module 32 comprises a base 321 and a plurality of heat sink fins 322, which is disposed on the base 321 in a radial arrangement. The above-mentioned heat sink fins 322 can be fabricated using a press forming process, and the base 321 may be manufactured using a press casting process. Next, the heat sink fins 322 are fixed to the base 321 by soldering. Moreover, the other side of the base 321 is adapted to contact with a heat-generating source, which may be, for example, an LED light bar or other electronic components.

Figure 2:
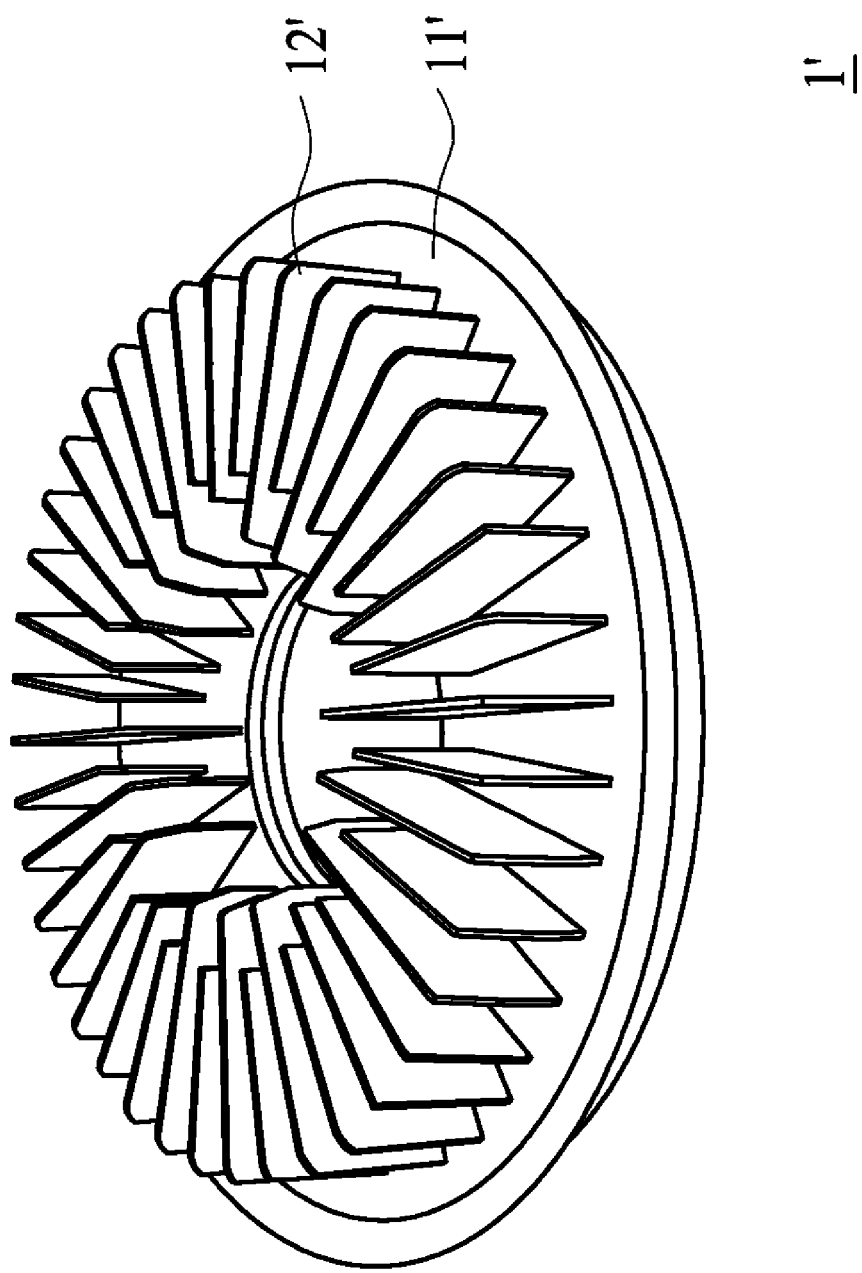
FIG. 2 shows another traditional heat sink module.

Compared to the heat sink fins 12' of a passive heat sink module 1' shown in FIG. 2, the heat sink fins 322 of the present embodiment are not fabricated using the press casting process so that the thickness of the fins can be reduced. Moreover, when a manufacturer wishes to make a passive heat sink module 32 with more or fewer heat sink fins 322, the desired number of heat sink fins 322 are simply prepared and soldered to the based 321, and no new die is required. As such, the manufacturing cost of the heat sink module 32 is reduced.

The above-described embodiments of the present invention are intended to be illustrative only. Numerous alternative embodiments may be devised by persons skilled in the art without departing from the scope of the following claims.

What is claimed is:

1. A light emitting diode (LED) lighting device, comprising:
   an LED light bar; and
   a passive heat sink module, comprising:
   a base, wherein said LED light bar is disposed on one side of said base; and
   a plurality of heat sink fins disposed on the other side of said base, wherein said plurality of heat sink fins is soldered on said base, each of said plurality of heat sink fins comprising:
   a main slice;
   at least one connecting slice, wherein said connecting slice is disposed on and protrudes from a lateral side of said main slice, and said connecting slice includes at least one connecting convex strip; and
   at least one connecting concave notch disposed on said main slice, wherein said connecting convex strip of each of said plurality of heat sink fins engages into said connecting concave notch of an adjacent one of said plurality of heat sink fins.

2. The LED lighting device as in claim 1, wherein said plurality of heat sink fins is disposed on said base at uniform intervals.

3. The LED lighting device as in claim 1, wherein said plurality of heat sink fins is disposed on said base in a radial arrangement.

4. The LED lighting device as in claim 1, wherein said LED light bar is disposed on one side of said base in a locking manner, and a heat sink paste is applied between said LED light bar and said base.

5. The LED lighting device as in claim 1, wherein said plurality of heat sink fins is made by a press forming process.

6. A passive heat sink module, comprising:
   a base; and
   a plurality of heat sink fins disposed on one side of said base,
   wherein said plurality of heat sink fins is soldered on said base, each of said plurality of heat sink fins comprising:
   a main slice;
   at least one connecting slice, wherein said connecting slice is disposed on and protrudes from the lateral side of said main slice, and said connecting slice includes at least one connecting convex strip; and
   at least one connecting concave notch disposed on said main slice, wherein said connecting convex strip of each of said plurality of heat sink fins can engage into said connecting concave notch of an adjacent one of said plurality of heat sink fins.

7. The passive heat sink module as in claim 6, wherein said plurality of heat sink fins is made by a press forming process.

8. The passive heat sink module as in claim 6, wherein said plurality of heat sink fins is disposed on said base at uniform intervals.

9. The passive heat sink module as in claim 6, wherein said plurality of heat sink fins is disposed on said base in a radial arrangement.

10. A lighting device, comprising:
    a light bar; and
    a passive heat sink module, comprising:
    a base, wherein said light bar is disposed on one side of said base; and
    a plurality of heat sink fins disposed on the other side of said base, wherein said plurality of heat sink fins is soldered on said base, each of said plurality of heat sink fins comprising:
    a main slice;
    at least one connecting slice, wherein said connecting slice is disposed on and protrudes from the lateral side of said main slice, and said connecting slice includes at least one connecting convex strip; and
    at least one connecting concave notch disposed on said main slice, wherein said connecting convex strip of each of said plurality heat sink fins engages into said connecting concave notch of an adjacent one of said plurality of heat sink fins.

11. The lighting device as in claim 10, wherein said plurality of heat sink fins is disposed on said base at uniform intervals.

12. The lighting device as in claim 10, wherein said plurality of heat sink fins is disposed on said base in a radial arrangement.

13. The lighting device as in claim 10, wherein said light bar is disposed on one side of said base in a locking manner, and a heat sink paste is applied between said LED light bar and said base.

14. The lighting device as in claim 10, wherein said plurality of heat sink fins is made by a press forming process.

15. The lighting device as in claim 10, wherein said light bar comprises at least one light emitting diode (LED).

* * * * *